United States Patent
Freitas et al.

(10) Patent No.: US 7,482,674 B1
(45) Date of Patent: Jan. 27, 2009

(54) CRYSTALLINE III-V NITRIDE FILMS ON REFRACTORY METAL SUBSTRATES

(75) Inventors: Jaime A. Freitas, Burke, VA (US); Larry B. Rowland, Scotia, NY (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/957,544

(22) Filed: Dec. 17, 2007

(51) Int. Cl.
*H01L 29/12* (2006.01)
*H01L 21/36* (2006.01)

(52) U.S. Cl. ...................... 257/613; 438/478
(58) Field of Classification Search ................. 257/613; 438/478

See application file for complete search history.

(56) References Cited

U.S. PATENT DOCUMENTS

| | | | |
|---|---|---|---|
| 6,086,673 A * | 7/2000 | Molnar | 117/90 |
| 6,459,100 B1 * | 10/2002 | Doverspike et al. | 257/97 |
| 6,580,101 B2 * | 6/2003 | Yoshida | 257/192 |
| 2008/0132044 A1 * | 6/2008 | Kyono et al. | 438/503 |

OTHER PUBLICATIONS

Amano et al., "Metalorganic vapor phase epitaxial growth of a high qualityh GaN film using an AIN buffer layer" Appl. Phys. Lett., 45(5), 353-355 (1986).
Freitas et al., "Electronic Properties of GaN Films Grown on TiC Substrates" Electrochem. and Solid State Lett., 10 (2), H72-H73 (Dec. 18, 2006).
Freitas, et al., "Epitaxial GaN on refractory metallic substrates for verticle devices" presented at ICNS-2007, Las Vegas, NV (2007).
Freitas, et al., "Properties of epitaxial GaN on refractory metal substrates" Appl. Phys. Lett., 90, 091910 (2007).
Freitas et al., Superlattices and Microstructures, 40, 191-194 (2006).
Koleske et al., "Surface Energy Constraints for Heteroepitaxial Growth on Compliant Substrates: Morphology of GaN Grown on Sc Layers" Mat. Res. Soc. Symp. Proc., 449, 347-353 (1997).
Tampo et al., "Strong Photoluminescence Emission from GaN on SrTiO3" Phys. Status Solidi B, 216, 113-116 (1999).
Yamada et al., "Strong photoluminescence emission from polycrystalline GaN layers grown on W, Mo, Ta, and Nb metal substrates" Appl. Phys. Lett., 78(19), 2849-2851 (2001).
Yoshida et al., "Improvements on the electrical and luminescent properties of reactive molecular beam epitaxially grown GaN films by using AIN-coated sapphire substrates" Appl. Phys. Lett., 42(5), 427-429 (1983).

* cited by examiner

*Primary Examiner*—Evan Pert
(74) *Attorney, Agent, or Firm*—John J. Karasek; Joseph T. Grunkemeyer

(57) ABSTRACT

An article of manufacture having a substrate having a top surface and a first layer on the top surface. The top surface contains titanium carbide, vanadium carbide, zirconium carbide, niobium carbide, hafnium carbide, tantalum carbide, tungsten carbide, chromium nitride, molybdenum nitride, tungsten nitride, titanium nitride, vanadium nitride, zirconium nitride, or a combination thereof. The first layer contains one or more group III-V metal nitrides.

23 Claims, 7 Drawing Sheets

Error! Objects cannot be created from editing field codes.

CRYSTALLINE III-V NITRIDE FILMS ON REFRACTORY METAL SUBSTRATES

FIELD OF THE INVENTION

The invention is generally related to group III-V metal nitride films.

DESCRIPTION OF RELATED ART

The III-nitride semiconductor system possesses a unique combination of physical and chemical properties that allows the formation of alloys and heterostructures necessary for the fabrication of optical devices and electronic devices capable of operating at high power and high temperature and/or under extreme environmental conditions. Ternary or quaternary alloys of GaN, AlN, and InN have been grown to produce optical devices that emit light spanning from red to deep UV. Green, blue, near/deep-UV, and white light emitting devices, UV detectors, and near-UV lasers are presently commercially available.

Current methods of obtaining high-quality gallium nitride involve primarily the use of either sapphire, which is insulating, or silicon carbide, which is a semiconductor. Both of these materials have large lattice and thermal mismatch with gallium nitride and its alloys.

The improvement of the quality of thin heteroepitaxial nitride films achieved in the last decade results from a better understanding of the nitride nucleation process and control of the properties of the intermediate nucleation layers (commonly called low-temperature buffer layers). It was demonstrated that by adding a thin layer of GaN or AlN deposited at lower temperatures ($\leqq 500°$ C.), between a sapphire substrate and the active layers (deposited at high temperatures, $\sim 1000°$ C.), an improvement of the structural and electronic properties of the top layers was achieved (Yoshida et al., *Appl. Phys. Lett.*, 42, 427 (1983); Amano et al., *Appl. Phys. Lett.*, 48, 353 (1986). All publications and patent documents referred to in this application are incorporated herein by reference).

SUMMARY OF THE INVENTION

The invention comprises an article of manufacture comprising: a substrate having a top surface comprising titanium carbide, vanadium carbide, zirconium carbide, niobium carbide, hafnium carbide, tantalum carbide, tungsten carbide, chromium nitride, molybdenum nitride, tungsten nitride, titanium nitride, vanadium nitride, zirconium nitride, or a combination thereof; and a first layer disposed on the top surface comprising one or more group III-V metal nitrides.

The invention further comprises a method comprising: providing a substrate having a top surface comprising titanium carbide, vanadium carbide, zirconium carbide, niobium carbide, hafnium carbide, tantalum carbide, tungsten carbide, chromium nitride, molybdenum nitride, tungsten nitride, titanium nitride, vanadium nitride, zirconium nitride, or a combination thereof; and depositing on the top surface a first layer comprising one or more group III-V metal nitrides.

BRIEF DESCRIPTION OF THE DRAWINGS

A more complete appreciation of the invention will be readily obtained by reference to the following Description of the Example Embodiments and the accompanying drawings.

DETAILED DESCRIPTION OF EXAMPLE EMBODIMENTS

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

The disclosed method may be useful for obtaining high-quality gallium nitride (GaN), aluminum nitride (AlN), indium nitride (InN) or their alloys on a refractory metallic substrate, such as titanium carbide for high-power and/or high-temperature device fabrication, especially field emitter arrays, bipolar devices, and Schottky diodes. The metallic substrates can allow the fabrication of vertical devices capable of operating at high temperature and high power. The vertical geometry can minimize the deleterious effects of dislocations on device performance, while the metallic substrate can avoid current crowding at the interface, minimize substrate and contact resistance, and improve thermal management.

Figure 12:
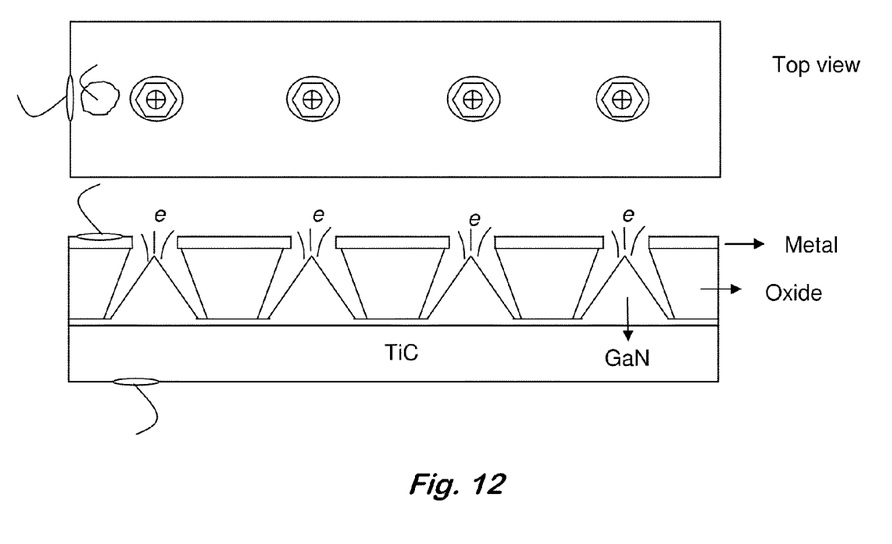
FIG. 12 schematically illustrates a field emitter array incorporating the GaN film.

Titanium carbide, a cubic material with rock-salt structure and maximum lattice parameter of 0.4331 nm, is fairly closely lattice-matched to gallium nitride. Titanium carbide is a metal, which may offer certain advantages. First of all, conduction losses from the substrate may be minimized. Such losses can be very significant in the case of gallium nitride-based light emitting diodes (LEDs) grown on silicon carbide. In the case of sapphire, electrical contacts must be placed on the front side of the device, cutting down on absorption in the case of detectors and emission in the case of emitters such as LEDs. Additionally, very high electrical fields can be placed on metals. In the case of an array of field emitters (FIG. 12) of GaN, AlN and InN, and their alloys, on a metallic substrate (e.g., titanium carbide), this may allow much more efficient field emission than possible on other substrate types. Selective epitaxial growth of hexagonal-based GaN pyramids on sapphire and SiC, and crystalline GaN nano-rods on sapphire have been accomplished. Improved electron emission was observed on these structures. However, such structures were not fabricated on metallic substrates. Another device type that may benefit from the disclosed article and method is Schottky diodes, which can be fabricated with vertical geometry to avoid current crowding commonly observed in planar devices. Other devices known in the art that include a group III-V metal nitride film such as GaN are also candidates for use of the disclosed article and method.

TiC is a close-packed interstitial compound with carbon atoms in all octahedral sites of the Ti sublattice. Because of the difficulties of controlling its stoichiometry, this semimetallic material is commonly referred to $TiC_x$. Due to its outstanding hardness (2800 kg/mm$^2$), exceptional wear resistance, and good stability at high temperatures, it has been largely used in many industrial applications. TiC is closely lattice-matched to GaN with a 3.5% lattice mismatch between TiC (111) and GaN (0001). Its thermal expansion coefficient is $7.8 \times 10^6$ cm/cm·° C., which is larger than GaN but not as large as sapphire.

In one embodiment the method involves the epitaxial growth of GaN, AlN, InN or alloys or other combinations thereof on refractory substrates such as titanium carbide. Films may be formed by, for example, organometallic vapor phase epitaxial apparatus or molecular beam epitaxial apparatus. The III-V nitride and/or its alloys and/or heterostructures may be used for electronic devices such as field-effect transistors, light emitting devices such as light emitting diodes and lasers with emission wavelengths from the green to the ultraviolet, and detectors primarily in the ultraviolet range, and especially on field emitter arrays. It was demonstrated that a refractory metal such as titanium carbide could be used to deposit gallium nitride films with quality comparable those deposited on sapphire or silicon carbide substrates. On a metallic substrate, no alloyed ohmic contact to the substrate is necessary unlike the case of silicon carbide. There is minimal resistance in an electronic or optoelectronic device, meaning that substrate heating during device operation is greatly reduced. Additionally, high electric fields can be placed on metals, which makes achieving the high electric fields needed for field emission of gallium nitride, aluminum nitride, indium nitride, and/or their alloys, and/or heterostructures much more feasible than on an insulating or semiconductor substrate.

At least the top surface of the substrate and up to the entire substrate comprises one of the carbides or nitrides. Suitable materials for the top surface include, but are not limited to, titanium carbide, titanium nitride, tungsten carbide, tantalum carbide, and vanadium carbide. The nitrides and carbides having a low lattice mismatch with the group III, IV, or V metal nitride to be deposited are suitable, as are nitrides and carbides having a low thermal expansion coefficient and a high thermal stability. The use of a high temperature substrate allows for deposition of GaN at a high temperature without melting other otherwise altering the substrate.

The substrate may be cleaned by heating to at least about 1300° C. This can remove any organic contaminants on the surface.

The substrate may have one or two layers of group III-V metal nitrides. Each layer can comprise more than one of such nitrides in alloy form or any other combination. Suitable nitrides include, but are not limited to, gallium nitride, aluminum nitride, and indium nitride. When two layers are used, the first layer adjacent to the substrate may be a nucleation layer, also known as a buffer layer or an intermediate layer. The nucleation layer may be thinner than a single layer would be and may have a lattice parameter between that of the top surface and a second layer.

A nucleation layer may be deposited at a low temperature, such as about 200-500° C., while the second layer may be deposited at a higher temperature, such as 900-1100° C. Thus, the structure of the two layers may be different even when they have the same composition of nitrides. A suitable first layer may comprise aluminum nitride or one or more of gallium nitride, aluminum nitride, or indium nitride. A suitable second layer may comprise gallium nitride.

Figure 10:
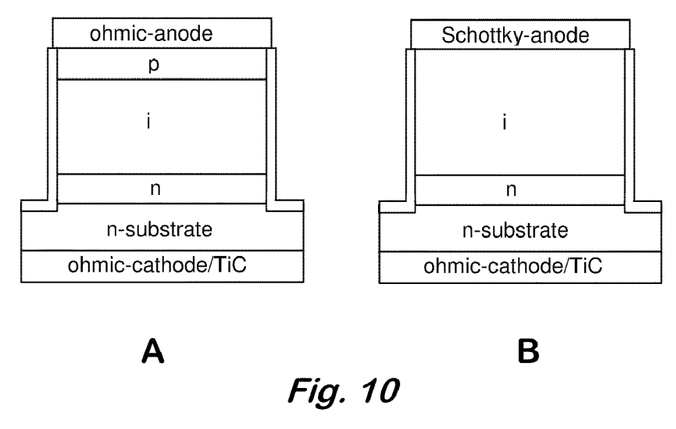
FIG. 10 schematically illustrates diodes incorporating the GaN film.
Figure 11:
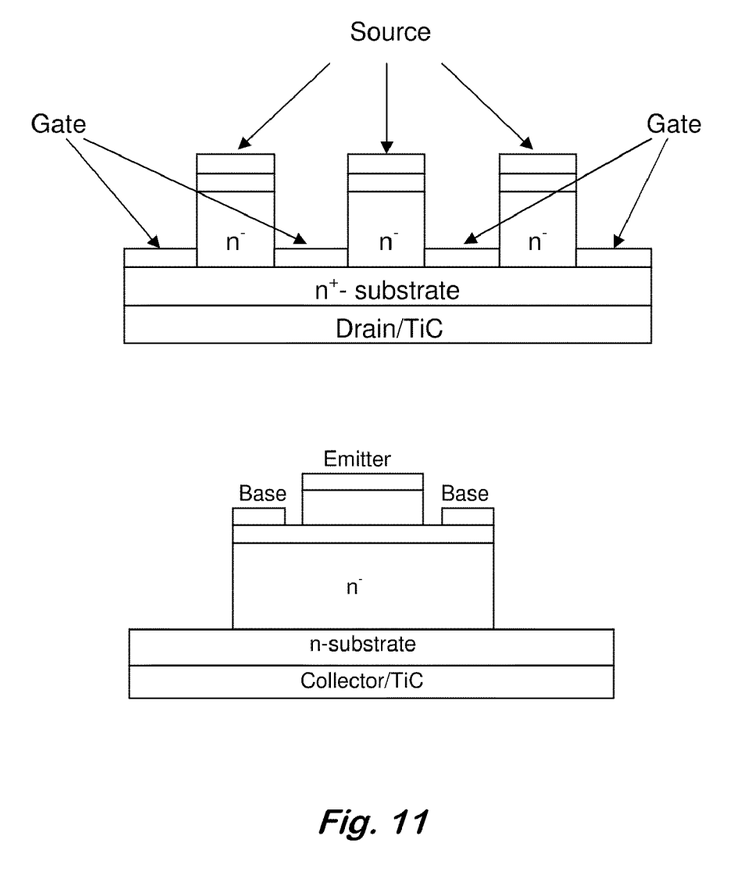
FIG. 11 schematically illustrates transistors incorporating the GaN film.

A diode, including bipolar, LED, and LD, or a Schottky diode may be made from the article by depositing ohmic or Schottky contacts on both the substrate and the top-most nitride layer. Such contacts may comprise nickel or any other material known in the art to be useful as the contact. The nitride layers may be doped as needed to produce diode characteristics. FIG. 10 shows example structures for a diode (A) and a Schottky diode (B). FIG. 11 shows example structures for transistors having TiC as the drain or collector. GaN doped layers, and metal contacts for the source/gate or emitter/base. The contacts may be directly on the first layer or the second layer, or another layer between the nitride and the contacts. Then n, n$^+$, n$^-$, p, and i layers may be appropriately doped GaN layers.

Having described the invention, the following examples are given to illustrate specific applications of the invention. These specific examples are not intended to limit the scope of the invention described in this application.

Example 1

General procedure—Titanium carbide substrates were loaded into a reactor for the epitaxial growth of gallium nitride or its alloys. Organometallic vapor phase epitaxy was used for this growth. Titanium carbide substrates were heated for a cleaning step up to 1350° C. for 3 min, then cooled down to 450° C. for growth of the nucleation layer. While aluminum nitride was utilized for the nucleation layer, a gallium nitride or alloyed aluminum/gallium/indium nitride nucleation layer can be used with the same resultant effect. Triethylaluminum (200 sccm flowed through a source at 1000 torr at a constant temperature of 30° C.) and 2.5 SLM (standard liters per minute) ammonia were used as reactants in 3.5 SLM hydrogen carrier gas. Following formation of the nucleation layer, which took approximately 13 min, the temperature was raised to 1000° C. over a period of 5 min. Once 1000° C. was reached, gallium nitride growth was commenced. Trimethylgallium (20 sccm flowed through a source at 1000 torr at a constant temperature of −8° C.) and 2.5 SLM ammonia were used as reactants in 3.5 SLM hydrogen carrier gas. Growth of the gallium nitride took place for 85 min. All growth took place at total pressure of 57 torr. Samples were cooled in 2.5 SLM ammonia and 3.5 SLM of hydrogen. Existence of high-quality single crystal gallium nitride was verified by X-ray measurements as well as low-temperature photoluminescence. Low background doping of $1 \times 10^{16}$ cm$^{-3}$ was verified by electrochemical capacitance-voltage profiling.

Example 2

The TiC substrates used were grown by a high-pressure float-zone method (Parsons et al., *Solid State Technol.*, 11, 133 (1990)). Epitaxial gallium nitride films of about 3.0 µm thickness were grown on both TiC (100) and (111) substrates by low-pressure organometallic vapor phase epitaxy (LP-OMVPE) in a vertical reactor geometry at 57 Torr. The surface of substrates 5 mm square and ~1 mm in thickness were solvent-cleaned and heated to 1350° C. in $H_2$ for 5 min prior to growth. Nucleation layers of AlN with 15 mm of thickness were then grown at 450° C. using triethylaluminum, ammonia, and hydrogen. AlN was used as the nucleation layer because its atomic spacing is intermediate to TiC and GaN and 1.5% mismatched to TiC. GaN films were then grown at 1000° C. using trimethylgallium, ammonia, and hydrogen. Films with a root-mean-square (rms) roughness of 0.55 nm (1×1 µm area) as determined by atomic force microscopy (AFM) were deposited. Submicrometer size pores, typically observed in the $TiC_x$ substrates were reproduced in the films. Doping density as a function of depth was extracted from capacitance-voltage (C-V) measurements at 3 kHz. These measurements were taken using a BioRad electrochemical C-V profiler with a Tiron electrolyte. Photoluminescence (PL) is a well-established nondestructive technique to detect and identify impurity and structural-related defects in semiconductors. Because of the simultaneous presence of a number of radiative and nonradiative recombination channels with different dynamics, PL is not a reliable quantitative technique. However, its sensitivity and spectral resolution can be conveniently used to provide qualitative information about defect concentrations (Bishop et al., *J. Cryst. Growth*, 106, 38 (1990)). The low-and variable-temperature PL measurements were carried out with the samples placed in the chamber of a continuous He flow cryostat that allowed temperature variation in the range between 1.6 and 320 K. The 325 nm line of a HeCd laser was used to photoexcite the carriers. Calibrated neutral density filters were employed to control the excitation power density. The light emitted by the sample was dispersed by a double-gating spectrometer with 1800 groves/mm. A UV-sensitive GaAs photomultiplier coupled to a computer-controlled photon counter was used for data acquisition and manipulation. The spectrometer calibration was verified with calibrated lines from an Hg lamp.

Figure 1:
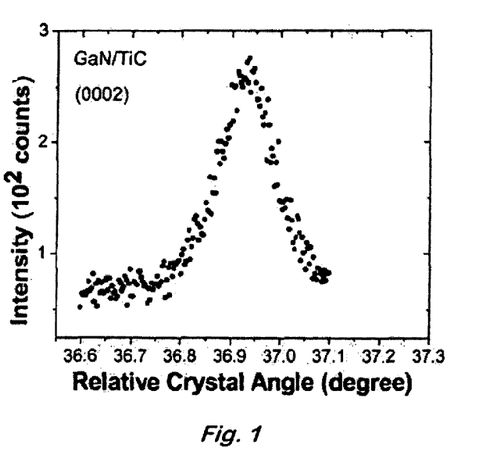
FIG. 1 shows the (0002) XRD diffraction spectra of the GaN sample deposited on (111) TiC substrate.

X-ray rocking curve measurements were performed on a Blake double-crystal diffractometer equipped with a Si (004) beam conditioner, using a 0.05 mm square cross section beam size. The (0002) X-ray diffraction (XRD) reflection of the GaN/TiC (111) sample, pictured in FIG. 1 yielded a symmetric line with full width at half maximum (fwhm) of about 400 arcsec, indicating good crystalline quality. Samples deposited on (100) TiC substrates resulted in polycrystalline films and they are not discussed.

Figure 2:
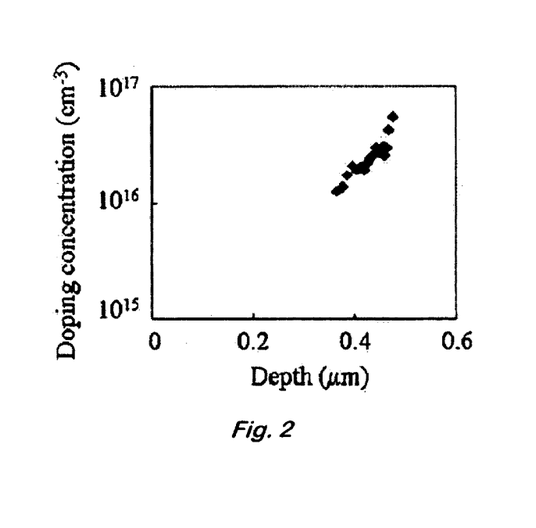
FIG. 2 shows doping as a function of depth near the surface of UID GaN film grown on $TiC_x$ measured by electrochemical C-V measurements.

FIG. 2 shows the electrochemical C-V profile of a (0001) GaN film grown on $TiC_x$ (111). Doping concentrations at the surface of this n-type unintentionally doped (UID) GaN are at or below $1\times10^{16}$ cm$^{-3}$. This is substantially lower than typically reported for GaN growth on sapphire. The doping concentration increases with increasing depth, which could be due to outdiffusion or autodoping from oxygen in the $TiC_x$. $TiC_x$ has a very strong affinity for oxygen and can incorporate in the percent range in thin films. Oxygen diffusion along low-angle grain boundaries in the $TiC_x$ into the GaN film is not unreasonable.

Figure 3:
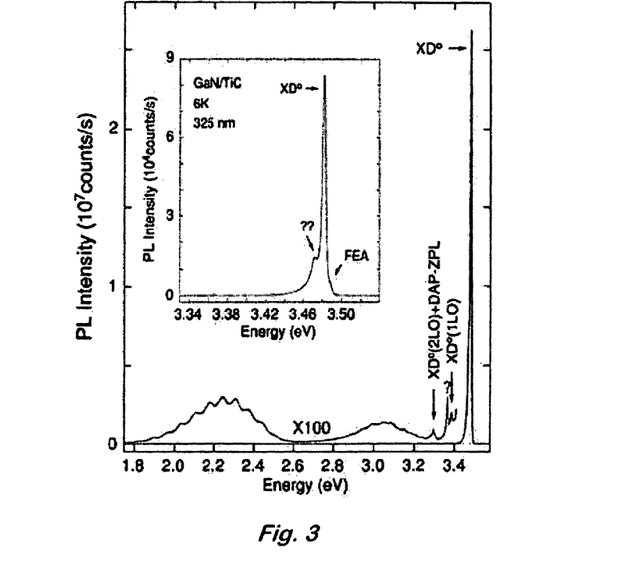
FIG. 3 shows 6 K PL of UID GaN film grown on $TiC_x$. The high-resolution spectrum of the film is shown in the insert. If the residual level of uncompensated donor is sufficiently low, the recombination involving FE should dominate the near-bandedge emission. The line represented by FEA is associated with the recombination process involving excitons in which holes are related to the valence band A.

UID GaN films deposited on sapphire substrates are n-type, with a carrier concentration typically between $5\times10^{16}$ and $5\times10^{17}$ cm$^{-3}$ and carrier mobilities between 300 and 640 cm$^2$/V·s. High-resistivity (HR) films ($10^{10}$ Ω·cm at 300 K) and Si-doped films with a carrier concentration around 2-5× $10^{17}$ cm$^{-3}$ and room-temperature mobilities larger than 600 cm$^2$/V·s have been reproducibly deposited on sapphire (Wickenden et al., *J. Electron. Mater.*, 24, 1547 (1995)). The low-temperature (6 K) PL spectrum of the HR films shows a relatively intense peak at 3.487 eV and, in addition to the commonly observed yellow luminescence band (around 2.25 eV), a band around 3.0 eV that has been associated with the partial compensation of the carriers. Recombination processes involving free-excitons (FE) and excitons bound to a neutral shallow donor ($XD^0$) dominate the bandedge emission of such films. This is an optical characteristic of high-quality films with low background concentration of uncompensated donors. Films with doping levels around $2-5\times10^{17}$ cm$^{-3}$ show a very intense bandedge emission ~3.478 eV and a weak yellow band. The $XD^0$ radiative process dominates the bandedge emission. Recombination processes associated with FE are observed only at temperatures above 30 K as a result of the thermal ionization of the exciton bounded to the shallow donors. This is an optical peculiarity of conductive films. FIG. 3 shows the 6 K PL spectrum of a UID GaN film deposited on $TiC_x$. Although the intensity of the bandedge emission at 3.482 eV is dominant. The ~2.25 and ~3.0 eV bands are observed in the 100× magnified spectrum, indicating that the donors are partially compensated. This is consistent with the observation of recombination process involving FE in the 6 K bandedge spectrum represented in the insert of FIG. 3. Thermal quenching studies of the PL bandedge spectra show a large contribution of FE recombination processes, also consistent with lower carrier concentration than the typical level of $\geq 1\times10^{17}$ cm$^{-3}$ in UID films deposited on sapphire. The observation of optical phonon replicas of the $XD^0$ (1 and 2 longitudinal optical) indicates the high quality of the film. Also observed were a weak shallow-donor-shallow-acceptor zero phonon line (DAP-ZPL) and a line represented by "?", which may be associated with a structural defect. The line represented by "??" in the inserted spectrum has not been identified yet. The FWHM of $XD^0$ of this thin film was 3.3 meV, which is close to the ~3 meV observed on ~3 µm thick films deposited on sapphire. The 5 meV red shift of the $XD^0$ may result from a smaller biaxial strain on films deposited on $TiC_x$ substrates than films on sapphire substrates.

Example 3

Substrates of (100) and (111) TiC, 5 mm square and ~1.0 mm thick, were loaded into an organometallic vapor phase epitaxy reactor for the GaN epitaxial growth. TiC substrates were heated in hydrogen at 1350° C. for 3 min, then cooled down to 450° C. for growth of a nucleation layer. Aluminum nitride was utilized for the nucleation layer. A GaN or alloyed AlInGaN nucleation layer can also be used with the same result. Triethylaluminum ($1.5\times10^{-4}$ mol/min) and 2.5 SLM (standard liters per minute) ammonia were used as reactants in 3.5 SLM hydrogen carrier gas. Following formation of the nucleation layer, which took approximately 13 min, the temperature was raised to 1000° C. over a period of 5 min. Once 1000° C. was reached, GaN growth commenced. Trimethylgallium ($4.1\times10^{-5}$ mol/min) and 2.5 SLM ammonia were used as reactants in 3.5 SLM hydrogen carrier gas. Growth of the GaN took place for 85 min. All growth was carried out at a total pressure of 57 torr. Samples were cooled in 2.5 SLM ammonia and 3.5 SLM of hydrogen. Growth on substrates of (100) TiC resulted in polycrystalline GaN with rough morphology. All results discussed here after involve GaN on (111) TiC. The center of the unintentionally doped (UID) film grown on (111) TiC was about 3.3 µm thick, measured by fitting reflectance interference fringes in the spectral range between 1.45 and 3.3 eV. A surface roughness of 0.55 nm was measured by atomic force microscopy. A film thickness reduction at positions away from the center of the sample was observed. Scanning electron micrography probing, also performed in the central region of the sample, confirmed the good surface morphology. However, the presence of pores (nanopipes) was also observed. These pores were just a reproduction of the pores present at the substrate surface. Close to the edge of the sample three-dimensional GaN growth, was observed, which may be introduced by temperature variation and/or flow turbulence.

Figure 4:
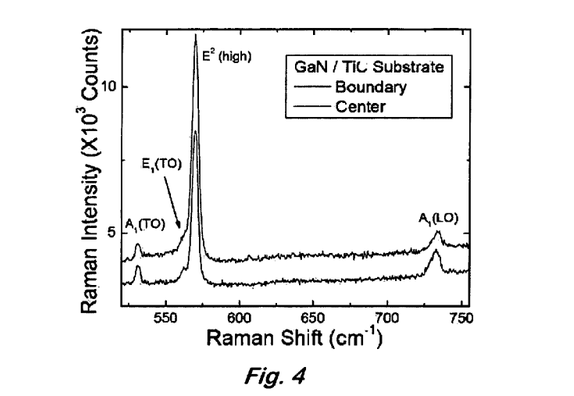
FIG. 4 shows first-order Raman scattering spectra of the GaN/TiC. Note the small increase in the phonon linewidths in the region away from the central part of the film.

The (0002) x-ray diffraction reflection yielded a symmetric line with full width at half maximum (FWHM) of 420 arc sec, obtained by fitting the spectrum with a single Gaussian. This value is only 25% larger than the average FWHM value of optimized GaN films deposited on vicinal-cut, a-plane sapphire substrates, for which FWHM values span from 258 to 425 arc sec for vicinal-cut orientation between 0° and 1°, respectively. However, large differences have been reported for small vicinal-cut a-plane and on-axis c-plane sapphire substrates, for which a FWHM of ≦269 arc sec is observed for vicinal-cut orientation between 0.25° and 0.4°. The first-order room temperature Raman scattering spectra, measured at the center and at a point 2.5 mm away, are shown in FIG. 4. The peak position and relatively small linewidth of the allowed phonons indicate the good crystalline quality and low residual stress of the film. Comparison of the $E_2$ (high) phonon frequency with that of a high-quality freestanding hydride vapor phase epitaxial GaN substrate indicates that the film is under smaller tensile stress, only 0.3 GPa. as compared with films on sapphire substrates (Kim et al., *Electrochem. Solid-State Lett.*, 8, G345 (2005). $A_1$(LO) phonon line shape analyses yield carrier concentrations of $1.9\times10^{17}/cm^3$ and $2.5\times10^{17}/cm^3$ at the center and 2.5 mm away from the center, respectively. These values are in excellent agreement with capacitance-voltage measurements carried out on this film, considering that the Raman scattering measurements probe the total thickness of the films.

Figure 5:
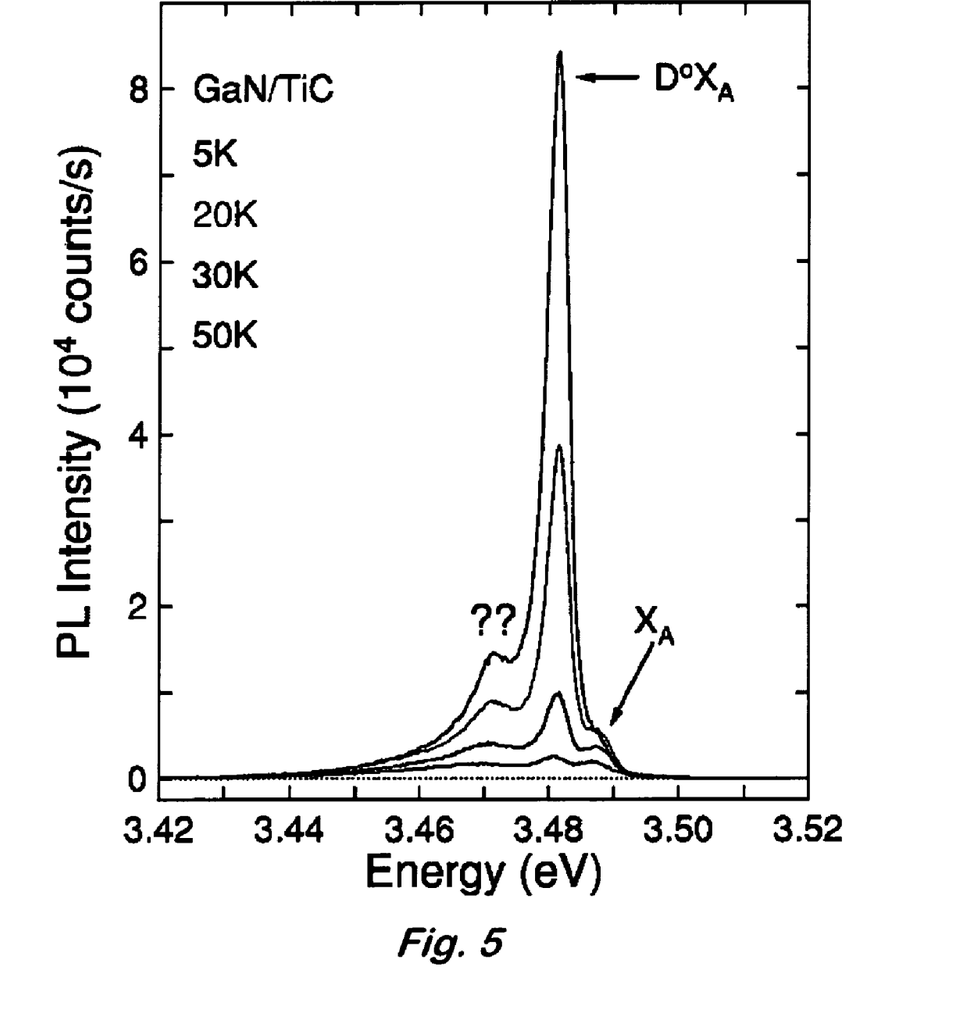
FIG. 5 shows high-resolution photoluminescence spectrum of the GaN/TiC film in the near band edge spectral region, taken from the inset of FIG. 3. Note that the FEA (XA) emission line becomes dominant with increasing sample temperature.

Higher resolution PL measurements, as represented in FIG. 5 (taken from the from FIG. 3), clearly show the presence of recombination processes due to free excitons, which involve holes from valence band A, commonly represented by "FEA" or $X_A$. Thermal quenching studies of the PL band edge spectra, highlighted in FIG. 5, show increasing contribution of FEA recombination processes with increasing sample temperature. Line shape fitting analyses indicate that the integrated intensity of the $D^\circ X_A$ line decreases more than twofold in the temperature range between 5 and 25 K, while the integrated intensity of the FEA line increases by a similar ratio. Therefore, the increase of the population of free excitons is directly related to the thermal release of the excitons from the shallow neutral donor(s). This observation is consistent with a high crystalline quality heteroepitaxial film characterized by a lower carrier concentration than the typical level of $\geqq 1\times10^{17}$ cm$^{-3}$ in UID films deposited on sapphire or SiC. GaN films with this carrier concentration or greater require higher temperatures to thermally release excitons due to the high excess of shallow neutral donors with large recapture cross section. This thermal quenching behavior is also consistent with a relatively small contribution from competing nonradiative recombination processes. Note that the penetration depth of the 325 nm HeCd laser line used in the PL experiment is only about 0.1 µm, which indicates that the lower carrier concentration region is located near the film surface. This observation is in agreement with the C-V study of this film, which yields a carrier concentration of about $1\times10^{16}$ electrons/cm$^3$ at the film's surface. The C-V measurements also show that the doping concentration increases with increasing depth, as suggested by the micro-Raman studies, which probe the total film thickness.

Investigation of vertical and lateral electronic transport properties of GaN on sapphire has indicated that dislocations are responsible for the sixfold reduction of the carrier mobility on planar Schottky diodes (Misra et al., *Appl. Phys. Lett.*, 76, 1045 (2000)). Recent study of vertical Schottky diodes fabricated on thick freestanding GaN substrates confirms this observation (Zhou et al., *Appl. Phys. Lett.*, 88, 113509 (2001)). In addition, Zhou et al. confirmed the potential of GaN for the fabrication of rectifiers and switching devices based on the observed high breakdown fields and ultrafast reverse recovery device characteristics.

Figure 6:
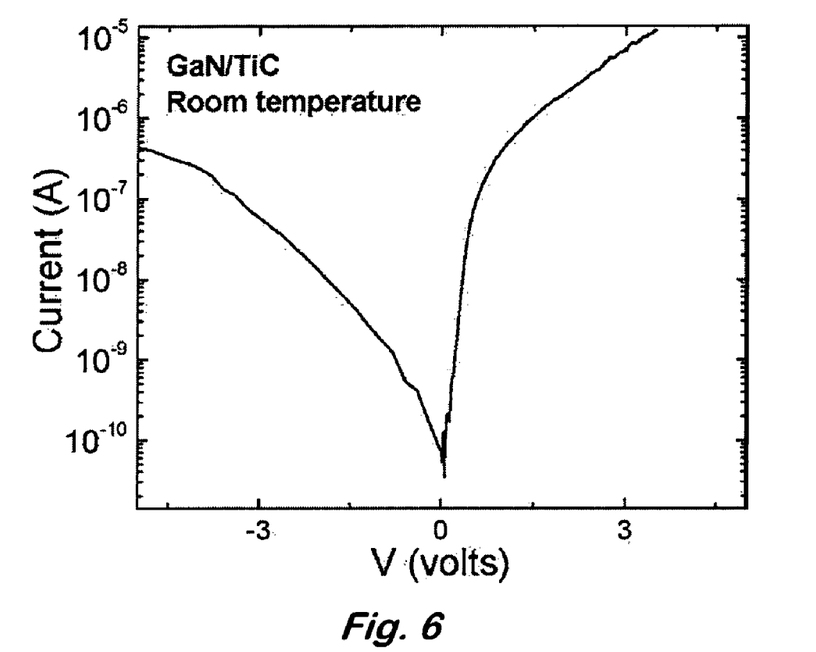
FIG. 6 shows I-V characteristics of the GaN film on (111) TiC mounted on a device carrier, measured with a point probe at the GaN surface.

To obtain insights into the transport properties of the GaN films on TiC substrates and their potential application for vertical electronic devices, we measured the I-V characteristics of the film deposited on (111) TiC substrate. The TiC substrate was bonded to a device carrier, which provides good ohmic contact and thermal stability. The I-V curve represented in FIG. 6 was acquired with an HP4145B semiconductor parameter analyzer at room temperature, using a point probe at the GaN surface. This curve is typical for the combination of Schottky (point probe) and Ohmic (GaN film and TiC substrate interface) contacts. This preliminary result suggests that this structure may be adequate for vertical device fabrication. The lower contact resistance, lack of current crowding, and high-temperature stability, combined with the simplicity of the device structure and fabrication, should make GaN/TiC reliable and convenient for high-power and/or high-temperature device applications.

Example 4

Diode—(111) TiC plates were used as substrates for growth of GaN epitaxial film by organometallic vapor phase epitaxy process. Prior to GaN film deposition, a hydrogen etching process was used for TiC surface cleaning and an aluminum nitride (AlN) buffer layer was deposited in order to reduce lattice mismatch between GaN and TiC. A mixture of triethylaluminum and ammonia gases was used as reactants for growth of the AlN buffer layer. For 3.3 µm GaN film deposition trimethylgallium ($4.1\times10^{-5}$ mol/min) and 2.5 SLM ammonia were used. Estimated growth speed of the process was around 2.7 µm/h. Hydrogen as carrier gas was used for both processes. All growth was carried out at a total pressure of 57 Torr. Measured by C-V doping concentration of the layer approximately $5\times10^{16}$ cm$^{-2}$.

A standard photolithography process was employed to fabricate the Schottky diodes without edge termination. Schottky contacts with thickness of 2000 nm were formed by e-beam deposition of Ni. Due to the high density of macro defects in a grown material, the diameter of Schottky contacts was limited to 20 µm, with a goal to form a number of defect free devices. The titanium carbide substrate was used as the backside Ohmic contact. Current-voltage (I-V) measurements were conducted using a HP4145B parameter analyzer. A LEO 435VP scanning electron microscope was employed to obtain secondary electron and EBIC images of structures. For micro-Raman spectroscopy, 488 nm Ar-ion laser integrated with Triax550 spectrometer equipped with cooled CCD camera was used. The power of the probe laser beam after passing through the internal optics of microscope was ~5 mW.

Figure 7:
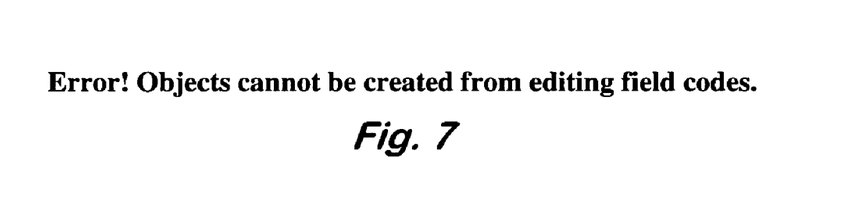
FIG. 7 shows typical current-voltage characteristics of Schottky contacts at room temperature.
Figure 8:
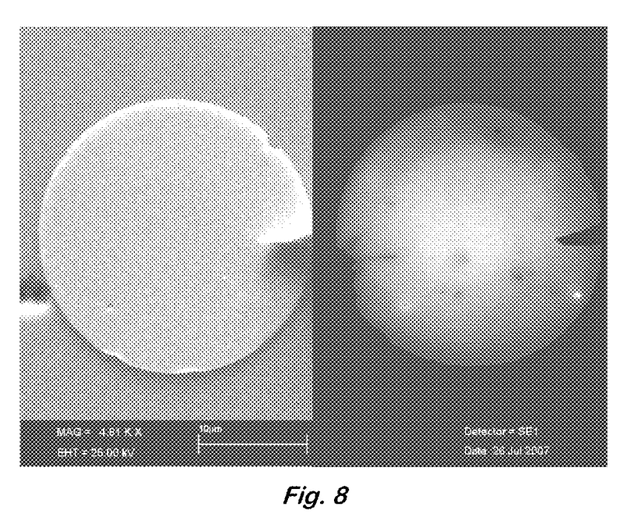
FIGS. 8 and 9 show SEM and EBIC images of Schottky contacts.
Figure 9:
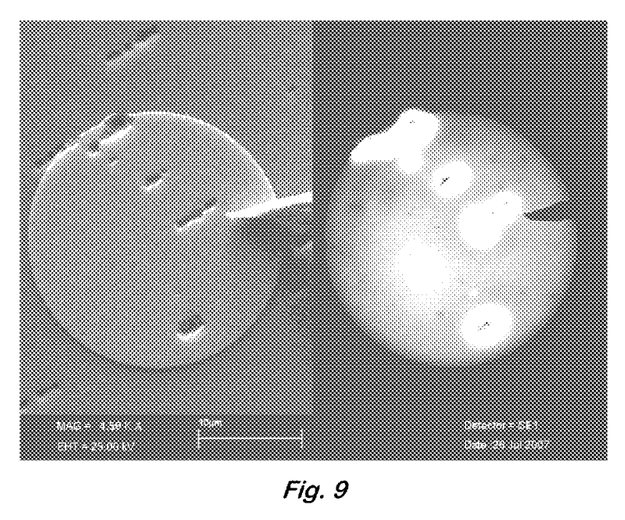

FIG. 7 shows typical current-voltage characteristics of Schottky contacts at room temperature (25° C.). By comparison, there was hugh leakage current from bad areas due to many defects. I-V characteristics from the area with more defects became more conductive compared with that with fewer defects. Saturation current is given by $$AA^*T^2\exp\left(\frac{-q\phi_B}{kT}\right),$$

where A is the area of the diode, A* is Richardson's constant (A/cm$^2$·K$^2$), and $\phi_B$ is the effective Schottky barrier height. Estimated Schottky barrier height for contacts with reduced number of defects was 0.61 eV. The EBIC images of Schottky and p-n diodes are presented in FIGS. 8 and 9. The EBIC image of the Schottky contact at an accelerating potential of 25 kV demonstrates electrically active defects. The degree of contrast generated by the defects in the EBIC image depends on the mechanism of recombination processes of the generated excess free charge carriers. The brighter regions correspond to areas where the EBIC current is higher, while darker regions correspond to lower currents. Based on modeling of EBIC contrast, variations in contrast are the defined by the relationship between carrier lifetime at the defect, $\tau_d$, and carrier lifetime in the surrounding region, $\tau$. A dark contrast corresponds to a higher recombination rate at the defect ($\tau_d<\tau$), and a bright contrast corresponds to a lower recombination rate at the defect ($\tau_d>\tau$) (Leamy, *J. Appl. Phys.*, 53, R51 (1982)).

FIG. 8(A) shows an SEM image from the good area (fewer defects). The sharp tip in the right is the probe tip for EBIC measurements. A Schottky contact with 20 μm diameter nickel barely avoided a defect in the left side of FIG. 8(A), but the EBIC image in FIG. 8(B) shows that there was still an effect from it under Ni metallization even through the defect under Ni is not noticeable from SEM, where total number of defects in FIG. 8 is much less than those in FIG. 9. In FIG. 9(B), bright spots are considered as the defects in epitaxial layer, where the minority collection efficiency in this area is much higher than that in outer area. The contrast in the EBIC image depends on many factors such as local doping concentrations and defects (caused by processing and growth). EBIC images from FIGS. 8(B) and 9(B) confirmed that the difference in I-V characteristics from both good areas (less defects) and bad areas (more defects) resulted from these defects. Also, FIGS. 8(A) and 8(B) show that the junction between the Schottky contact and the n-GaN/TiC were good enough to collect the minority carriers.

Micro-Raman spectroscopy was employed for detailed characterizations because the resolution of micro-Raman spectroscopy using a 488 nm Ar-ion laser can be less than 1 μm, which is much bigger than the size of defects. In this system, the spatial resolution was 0.8 μm. From a good area, A1(LO) and E2(High) phonons were observed, which are Raman active modes in this backscattering geometry. But from defects, A1(TO) and E1(TO) phonons together with A1(LO) and E2(High) phonons were observed. A1(TO) and E1(TO) phonons are forbidden in this backscattering geometry for wurtzite structure under this growth plane. This indicates that the crystal structure inside defects is distorted even if the defects still have wurtzite structure. Also, line shape and peak position analyses of the A1(LO) phonon can provide information about free carrier density introduced by the phonon-plasmon interaction. The position of A1(LO) phonon tends to move higher wavenumber when the free carrier concentrations of sample increase. It concludes that the free carrier concentrations at the defect region are higher than those of the good area.

This is understandable, since it is very possible that GaN film has replicated defects from TiC substrate. It was found that predominant defects in TiC are subboundaries and pores. So these defects can be reproduced in the same defects into the structure of GaN layers grown on the TiC. This provides electrical shortening path of leakage current. This is a major obstacle for growth high quality GaN films.

Obviously, many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What is claimed is:

1. An article of manufacture comprising:
   a substrate having a top surface comprising titanium carbide, vanadium carbide, zirconium carbide, niobium carbide, hafnium carbide, tantalum carbide, tungsten carbide, chromium nitride, molybdenum nitride, tungsten nitride, titanium nitride, vanadium nitride, zirconium nitride, or a combination thereof; and
   a first layer disposed on the top surface comprising gallium nitride, aluminum nitride, or a gallium nitride/aluminum nitride/indium nitride alloy.

2. The article of claim 1, wherein the top surface comprises titanium carbide.

3. The article of claim 1, wherein the top surface comprises titanium nitride, tungsten carbide, tantalum carbide, or vanadium carbide.

4. The article of claim 1, wherein the first layer comprises gallium nitride or aluminum nitride.

5. The article of claim 1, further comprising:
   a first ohmic or Schottky contact disposed on the first layer opposite to the substrate.

6. The article of claim 1, further comprising:
   a second layer disposed on the first layer opposite to the substrate comprising a group III-V metal nitride;
   wherein the first layer is a nucleation layer.

7. The article of claim 6;
   wherein the top surface comprises titanium carbide;
   wherein the first layer comprises one or more of gallium nitride or aluminum nitride; and
   wherein the second layer comprises gallium nitride.

8. The article of claim 6, further comprising:
   a first ohmic or Schottky contact disposed on the second layer opposite to the first layer.

9. A transistor comprising the article of claim 1;
   wherein the top surface is a drain or collector;
   wherein contacts are formed above the first layer to form a gate and a source or a base and an emitter.

10. The article of claim 1, wherein the substrate is a titanium carbide substrate.

11. A method comprising:
    providing a substrate having a top surface comprising titanium carbide, vanadium carbide, zirconium carbide, niobium carbide, hafnium carbide, tantalum carbide, tungsten carbide, chromium nitride, molybdenum nitride, tungsten nitride, titanium nitride, vanadium nitride, zirconium nitride, or a combination thereof; and
    depositing on the top surface a first layer comprising gallium nitride, aluminum nitride, or a gallium nitride/aluminum nitride/indium nitride alloy.

12. The method of claim 11, wherein the top surface comprises titanium carbide.

13. The method of claim 11, wherein the top surface comprises titanium nitride, tungsten carbide, tantalum carbide, or vanadium carbide.

14. The method of claim 11, wherein the first layer comprises gallium nitride or aluminum nitride.

15. The method of claim 11, further comprising:
cleaning the substrate by heating the substrate to a temperature of at least about 1300° C.

16. The method of claim 11, further comprising:
forming a first ohmic or Schottky contact on the first layer opposite to the substrate.

17. The method of claim 11, further comprising:
depositing on the first layer a second layer comprising a group III-V metal nitride; wherein the first layer is a nucleation layer.

18. The method of claim 17;
wherein the top surface comprises titanium carbide;
wherein the first layer comprises one or more of gallium nitride or aluminum nitride; and
wherein the second layer comprises gallium nitride.

19. The method of claim 18, further comprising:
cleaning the substrate by heating the substrate to a temperature of at least about 1300° C;
cooling the substrate to a temperature below about 500° C. during depositing the first layer; and
heating the substrate to a temperature of at least about 900° C. during depositing the second layer.

20. The method of claim 17, further comprising:
forming a first ohmic or Schottky contact on the second layer opposite to the first layer.

21. The method of claim 11, further comprising:
forming a transistor incorporating the substrate and the first layer;
wherein the top surface is a drain or collector;
wherein contacts are formed above the first layer to form a gate and a source or a base and an emitter.

22. The method of claim 11, wherein the substrate is a titanium carbide substrate.

23. A field emitter array comprising:
the article of claim 1;
wherein the first layer comprises columns of gallium nitride;
an oxide film on the first layer having holes containing the columns; and
a metal on the oxide film having holes that expose the columns.

* * * * *